(12) United States Patent
Sato

(10) Patent No.: US 6,791,426 B2
(45) Date of Patent: Sep. 14, 2004

(54) BALANCED OSCILLATOR AND ELECTRONIC APPARATUS INCLUDING THE SAME

(75) Inventor: Fumitoshi Sato, Yasu-gun (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/454,422

(22) Filed: Jun. 3, 2003

(65) Prior Publication Data

US 2003/0231070 A1 Dec. 18, 2003

(30) Foreign Application Priority Data

Jun. 18, 2002 (JP) ........................................ 2002-177718

(51) Int. Cl.[7] ................................................ H03B 5/00
(52) U.S. Cl. .............................. 331/117 R; 331/177 V; 331/177 R; 331/107 R; 331/108 R
(58) Field of Search ...................... 331/117 R, 117 FE, 331/177 R, 108 R, 107 R, 177 V, 132

(56) References Cited

U.S. PATENT DOCUMENTS 4,270,102 A * 5/1981 Gawler et al. ............... 331/115
6,411,170 B2 * 6/2002 Hino ...................... 331/117 R

* cited by examiner

Primary Examiner—Arnold Kinkead
(74) Attorney, Agent, or Firm—Ostrolenk, Faber, Gerb & Soffen, LLP

(57) ABSTRACT

A balanced oscillator includes a differential oscillator circuit having two output terminals, and a differential amplifier circuit having two input terminals each being connected with a respective one of the two output terminals of the differential oscillator circuit. The direct-current path of the differential oscillator circuit is connected in series with the direct-current path of the differential amplifier circuit.

6 Claims, 4 Drawing Sheets

PRIOR ART

BALANCED OSCILLATOR AND ELECTRONIC APPARATUS INCLUDING THE SAME

BACKGROUND OF THE INVENTION

1. Field of the Invention

The present invention relates to a balanced oscillator and an electronic apparatus including the same, and more specifically to a balanced voltage-controlled oscillator for use as a local oscillator in a cellular telephone, for example, and an electronic apparatus including the balanced voltage-controlled oscillator.

2. Description of the Related Art

In communication devices such as cellular telephones, oscillators such as voltage-controlled oscillators are used as local oscillators. Recently, with the popularity of integrated circuits within communication devices, the adoption of balanced signal processors has increased due to its resistance to common mode noise in its signal paths, and the demands for balanced oscillators capable of obtaining a balanced output have also increased.

FIG. 4 is a circuit diagram of a balanced oscillator 1 of the related art. In FIG. 4, the balanced oscillator 1 includes a differential oscillator circuit 2 and a differential amplifier circuit 3.

The differential oscillator circuit 2 includes transistors Q1 and Q2, resistors R1 and R2, capacitors C1, C2, and C3, inductors L1 and L2, varactor diodes VD1 and VD2, and a constant current source I1. The transistor Q1 has a collector connected with a d.c. power supply Vdc via the inductor L1, and a base connected with a bias power supply Vb via the resistor R1. The transistor Q2 has a collector connected with the d.c. power supply Vdc via the inductor L2, and a base connected with the bias power supply Vb via the resistor R2. The emitters of the transistors Q1 and Q2 are connected with each other and are also connected with a ground via the constant current source I1. The base of the transistor Q1 is connected to the collector of the transistor Q2 via the capacitor C1, and the base of the transistor Q2 is connected to the collector of the transistor Q1 via the capacitor C2. The collectors of the transistors Q1 and Q2 are connected with each other via the capacitor C3. The collector of the transistor Q1 is further connected to a control voltage input terminal Vc via the varactor diode VD1, and the collector of the transistor Q2 is also connected to the control voltage input terminal Vc via the varactor diode VD2.

In the differential oscillator circuit 2 of such a structure, the transistors Q1 and Q2 are cross-connected with each other via the capacitors C1 and C2 to perform differential oscillation at a frequency defined by the capacitance of the capacitors C1 through C3, the inductance of the inductors L1 and L2, and the capacitance of the varactor diodes VD1 and VD2. The differential oscillator circuit 2 has two outputs led from the collectors of the transistors Q1 and Q2. As is anticipated from the fact that the differential oscillator circuit 2 includes the varactor diodes VD1 and VD2, the differential oscillator circuit 2 is a voltage-controlled oscillating circuit; however, this is not an essential point to the present invention and a description thereof is thus omitted.

The differential amplifier circuit 3 includes transistors Q3 and Q4, and a constant current source I2. The transistor Q3 has a collector connected with the d.c. power supply Vdc, an emitter connected with an output terminal P1, and a base connected with the collector of the transistor Q1. The transistor Q4 has a collector connected with the d.c. power supply Vdc, an emitter connected with an output terminal P2, and a base connected with the collector of the transistor Q2. The emitters of the transistors Q3 and Q4 are connected with each other and are also connected with the ground via the constant current source I2.

The differential amplifier circuit 3 of such a structure receives and differentially amplifies the two differential output signals of the differential oscillator circuit 2. The differential amplifier circuit 3 has two outputs led to the output terminals P1 and P2 from the emitters of the two transistors Q3 and Q4, respectively.

In the balanced oscillator 1 of the related art, the differential oscillator circuit 2 and the differential amplifier circuit 3 are connected in parallel to the d.c. power supply Vdc in an independent manner. This requires separate constant current sources for driving the differential oscillator circuit 2 and the differential amplifier circuit 3, thus making it difficult to achieve low current consumption.

SUMMARY OF THE INVENTION

In order to overcome the foregoing problem, the present invention provides a compact balanced oscillator with low current consumption, and an electronic apparatus including the balanced oscillator.

In an aspect of the present invention, a balanced oscillator includes a differential oscillator circuit having two output terminals, and a differential amplifier circuit having two input terminals each being connected with each of the two output terminals of the differential oscillator circuit. The direct-current path of the differential oscillator circuit is connected in series with the direct-current path of the differential amplifier circuit.

Either one of the differential oscillator circuit and the differential amplifier circuit may be connected so as to operate as a constant current source of the other.

In another aspect of the present invention, an electronic apparatus includes the above-noted balanced oscillator.

Therefore, a balanced oscillator according to the present invention and an electronic apparatus including the balanced oscillator can achieve low current consumption and size reduction.

Other features and advantages of the present invention will become apparent from the following description of embodiments of the invention which refers to the accompanying drawings.

DESCRIPTION OF EMBODIMENTS OF THE INVENTION

Figure 1:
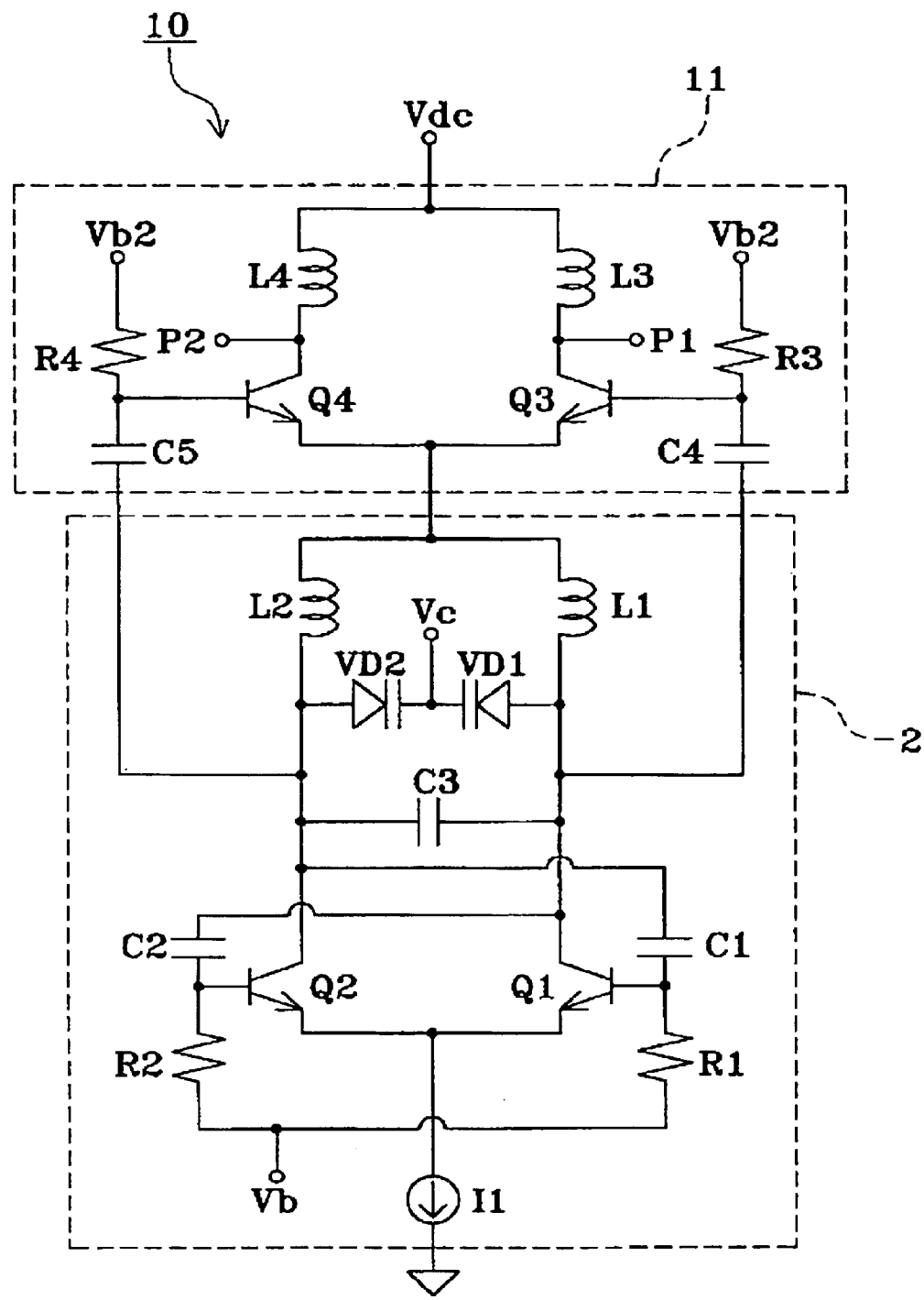
FIG. 1 is a circuit diagram of a balanced oscillator according to an embodiment of the present invention.
Figure 4:
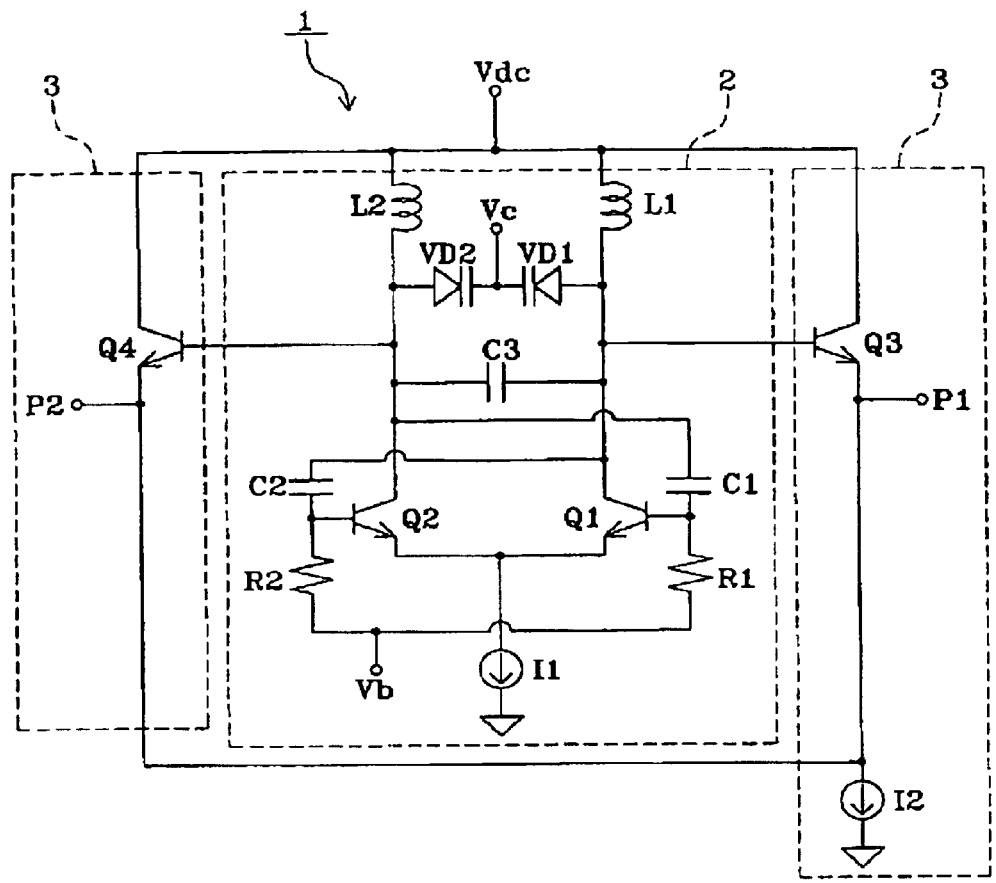
FIG. 4 is a circuit diagram of a balanced oscillator of the related art.

FIG. 1 is a circuit diagram of a balanced oscillator 10 according to an embodiment of the present invention. In FIG. 1, the same or equivalent portions to those shown in FIG. 4 are designated by the same reference numerals, and a description thereof is omitted.

In FIG. 1, the balanced oscillator 10 includes a differential oscillator circuit 2 and a differential amplifier circuit 11. The differential oscillator circuit 2 has basically the same structure as the differential oscillator circuit 2 of the balanced oscillator 1 of the related art, except that the inductors L1 and L2 are not connected with the d.c. power supply Vdc and the two output terminals of the differential oscillator circuit 2 are connected to different components from those in the related art.

The differential amplifier circuit 11 includes transistors Q3 and Q4, inductors L3 and L4, resistors R3 and R4, and capacitors C4 and C5. The transistor Q3 has a collector connected with an output terminal P1 and also connected with the d.c. power supply Vdc via the inductor L3, and a base connected with a bias power supply Vb2 via the resistor R3 and also connected with the collector of the transistor Q1 via the capacitor C4. The transistor Q4 has a collector connected with an output terminal P2 and also connected with the d.c. power supply Vdc via the inductor L4, and a base connected with the bias power supply Vb2 via the resistor R4 and also connected with the collector of the transistor Q2 via the capacitor C5. The emitters of the transistors Q3 and Q4 are connected with each other and are also connected with the inductors L1 and L2 of the differential oscillator circuit 2, respectively.

In the balanced oscillator 10 of such a structure, direct currents which flow in the transistors Q3 and Q4 of the differential amplifier circuit 11 are combined, and then flow to the ground via the transistors Q1 and Q2 of the differential oscillator circuit 2, respectively. In other words, the d.c. path of the differential amplifier circuit 11 and the d.c. path of the differential oscillator circuit 2 are connected in series (cascade-connected) with each other. Thus, unlike the balanced oscillator 1 of the related art, separate constant current sources are not required for driving the differential oscillator circuit and the differential amplifier circuit, so the invention achieves low current consumption.

In a typical differential amplifier circuit, for example, like the differential amplifier circuit 3 shown in FIG. 4, the constant current source I2 is required between the node of the emitters of the two transistors Q3 and Q4 and the ground. In the balanced oscillator 10 of the present invention, on the other hand, the differential amplifier circuit 11 does not include a constant current source, because the cascaded differential oscillator circuit 2 substantially functions as a constant current source of the differential amplifier circuit 11. In the balanced oscillator 10 of the present invention, therefore, the differential amplifier circuit 11 and the differential oscillator circuit 2 are cascaded, whereby a constant current source is removed from the differential amplifier circuit 11. This can reduce the circuit size, and can reduce the size of the overall balanced oscillator 10.

Figure 2:
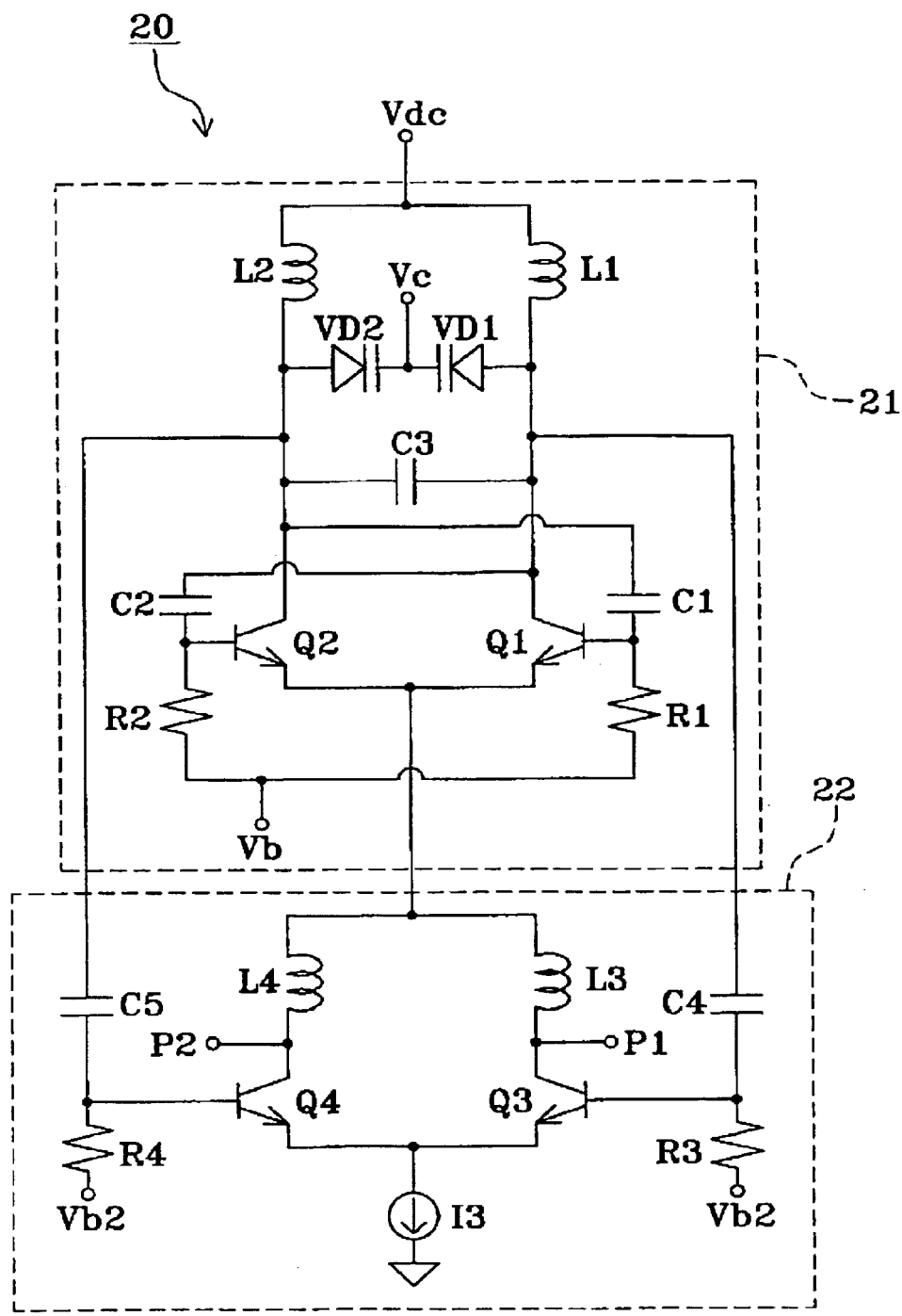
FIG. 2 is a circuit diagram of a balanced oscillator according to another embodiment of the present invention.

FIG. 2 is a circuit diagram of a balanced oscillator 20 according to another embodiment of the present invention. In FIG. 2, the same or equivalent portions to those shown in FIG. 1 are designated by the same reference numerals, and a description thereof is omitted.

The balanced oscillator 20 shown in FIG. 2 includes a differential oscillator circuit 21 and a differential amplifier circuit 22, and the d.c. path of the differential oscillator circuit 21 and the d.c. path of the differential amplifier circuit 22 are cascaded in this order.

The differential oscillator circuit 21 has basically the same structure as that of the differential oscillator circuit 2 of the balanced oscillator 10 shown in FIG. 1, except that the differential oscillator circuit 21 does not include the constant current source I1 and the inductors L1 and L2 are connected with the d.c. power supply Vdc. The differential amplifier circuit 22 has basically the same structure as that of the differential amplifier circuit 11 of the balanced oscillator 10 shown in FIG. 1, except that the inductors L3 and L4 are not connected with the d.c. power supply Vdc and the node of the emitters of the two transistors Q3 and Q4 is connected to the ground via a constant current source I3. Thus, the balanced oscillator 20 is configured such that the main differential oscillator circuit portion and the main differential amplifier circuit portion of the balanced oscillator 10 are substantially reversely cascaded.

The balanced oscillator 20 of such a structure operates basically in the same fashion as the balanced oscillator 10, and can achieve substantially the same advantages.

In the balanced oscillator 20, the constant current source I3 is added in the differential amplifier circuit 22 so that the differential oscillator circuit 21 does not require a constant current source, since the cascaded differential amplifier circuit 22 substantially functions as a constant current source of the differential oscillator circuit 21. Therefore, advantageously, a reduction in circuit size of the oscillator 20 can also be achieved.

In the balanced oscillator of the present invention, therefore, the differential oscillator circuit and the differential amplifier circuit may be cascaded in any order.

Although, in the balanced oscillators 10 and 20, only one of the differential oscillator circuit and the differential amplifier circuit includes a constant current source, the constant current source may also be connected between the differential oscillator circuit and the differential amplifier circuit, that is, connected to both of them. A balanced oscillator having this structure has less size reduction but still achieves low current consumption.

In the balanced oscillators 10 and 20, the active devices are implemented by bipolar transistors; however, the active devices may be implemented by other device types such as FETs (field-effect transistors). A balanced oscillator including other device types such as FETs would achieve similar advantages to those of the balanced oscillator including bipolar transistors.

Figure 3:
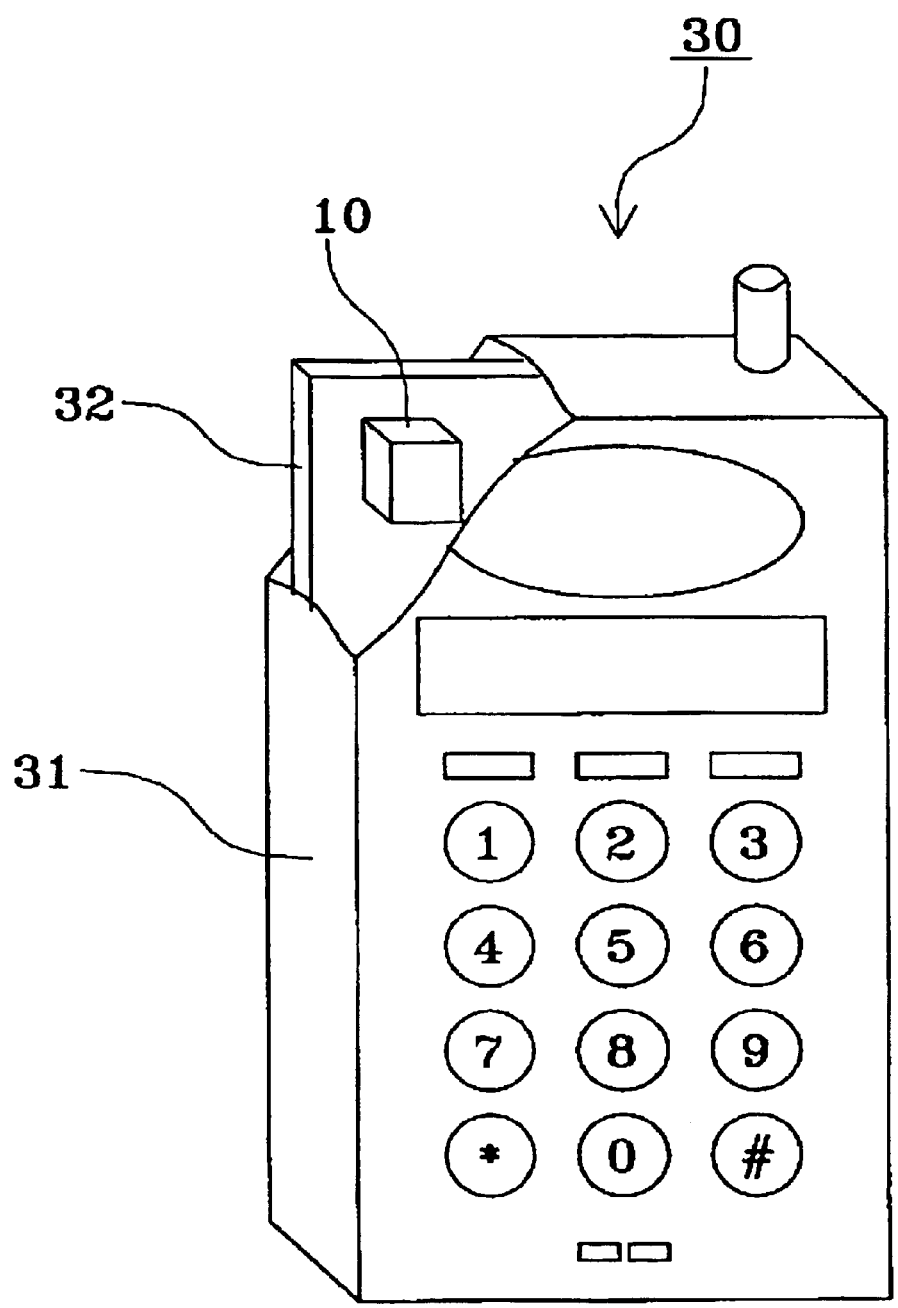
FIG. 3 is a perspective view of an electronic apparatus according to an embodiment of the present invention.

FIG. 3 is a perspective view of a cellular telephone 30 embodying an electronic apparatus according to the present invention. In FIG. 3, the cellular telephone 30 includes a housing 31 and, a printed circuit board 32 accommodated within the housing 31. The balanced oscillator 10 of the present invention, and other conventional RF, audio and other electronic circuits of a cellular telephone, are mounted on the printed circuit board 32.

The cellular telephone 30 which includes the balanced oscillator 10 of the present invention can be compact and have low current consumption.

Although FIG. 3 illustrates a cellular telephone as a form of the electronic apparatus according to the present invention, the cellular telephone is not a restrictive form of the electronic apparatus. The electronic apparatus may be any type of device as long as it employs the balanced oscillator of the present invention.

Although the present invention has been described in relation to particular embodiments thereof, many other variations and modifications and other uses will become apparent to those skilled in the art. Therefore, the present invention is not limited by the specific disclosure herein.

What is claimed is:

1. A balanced oscillator comprising:

a differential oscillator circuit having two output terminals; and a differential amplifier circuit having two input terminals each being connected with a corresponding one of the two output terminals of the differential oscillator circuit, wherein the differential oscillator circuit has a direct-current path and the differential amplifier circuit has a direct-current path, and the direct-current path of the differential oscillator circuit and the direct-current path of the differential amplifier circuit are connected in series between a DC supply terminal and a ground terminal of said balanced oscillator.

2. An electronic apparatus including the balanced oscillator according to claim 1, said balanced oscillator being connected to additional electronic circuits.

3. A balanced oscillator comprising:

a differential oscillator circuit having two output terminals; and a differential amplifier circuit having two input terminals each being connected with a corresponding one of the two output terminals of the differential oscillator circuit, wherein the differential oscillator circuit has a direct-current path and the differential amplifier circuit has a direct-current path, and the direct-current path of the differential oscillator circuit is connected in series with the direct-current path of the differential amplifier circuit; and wherein the differential oscillator circuit is associated with a constant current source, which constant current source further supplies a constant current to the differential amplifier circuit.

4. An electronic apparatus including the balanced oscillator according to claim 3, said balanced oscillator being connected to additional electronic circuits.

5. A balanced oscillator comprising:

a differential oscillator circuit having two output terminals; and a differential amplifier circuit having two input terminals each being connected with a corresponding one of the two output terminals of the differential oscillator circuit, wherein the differential oscillator circuit has a direct-current path and the differential amplifier circuit has a direct-current path, and the direct-current path of the differential oscillator circuit is connected in series with the direct-current path of the differential amplifier circuit; and wherein the differential amplifier circuit is associated with a constant current source, which constant current source further supplies a constant current to the differential oscillator circuit.

6. An electronic apparatus including the balanced oscillator according to claim 5, said balanced oscillator being connected to additional electronic circuits.

* * * * *